(12) United States Patent  
Imamura et al.

(10) Patent No.: US 8,962,996 B2
(45) Date of Patent: Feb. 24, 2015

(54) ELECTRONIC KEY FOR VEHICLE

(71) Applicant: Denso Corporation, Kariya, Aichi-pref. (JP)

(72) Inventors: Hikaru Imamura, Kariya (JP); Toshiaki Saito, Kariya (JP)

(73) Assignee: Denso Corporation, Kariya (JP)

( * ) Notice: Subject to any disclaimer, the term of this patent is extended or adjusted under 35 U.S.C. 154(b) by 87 days.

(21) Appl. No.: 13/719,683

(22) Filed: Dec. 19, 2012

(65) Prior Publication Data

US 2013/0161051 A1    Jun. 27, 2013

(30) Foreign Application Priority Data

Dec. 27, 2011 (JP) .................. 2011-285135

(51) Int. Cl.
*H05K 5/02* (2006.01)
*G07C 9/00* (2006.01)

(52) U.S. Cl.
CPC .......... *H05K 5/0217* (2013.01); *G07C 9/00944* (2013.01)
USPC ............................................ 174/50; 174/560

(58) Field of Classification Search
CPC ........................... H05K 5/0217; H05K 5/0243
USPC .................................................. 174/50, 560
See application file for complete search history.

(56) References Cited

FOREIGN PATENT DOCUMENTS

| DE | 10 2006 031 727 | 1/2007 |
|---|---|---|
| JP | 61-174781 | 10/1986 |
| JP | 6-86378 | 12/1994 |
| JP | 2004-131936 | 4/2004 |
| JP | 3706233 B2 | 8/2005 |
| JP | 4215480 B2 | 11/2008 |

OTHER PUBLICATIONS

Office Action dated Sep. 29, 2014 in corresponding Chinese Application No. 201210572913.1.

*Primary Examiner* — Timothy Thompson
*Assistant Examiner* — Charles Pizzuto
(74) *Attorney, Agent, or Firm* — Harness, Dickey & Pierce, PLC

(57) ABSTRACT

An electronic key for a vehicle includes a casing body, a lid, and a decorating member. The decorating member has a fixing part held between the casing body and the lid. The decorating member and one of the casing body and the lid have a restriction section at a position away from a fitting plane position of the casing body and the lid in a fitting direction. The restriction section becomes an engagement state when a force is applied in an engagement direction that crosses the fitting direction and the restriction section restricts release of the engagement state when a force is applied in an engagement releasing direction opposite from the engagement direction.

4 Claims, 8 Drawing Sheets

US 8,962,996 B2

ELECTRONIC KEY FOR VEHICLE

CROSS REFERENCE TO RELATED APPLICATIONS

The present application is based on and claims priority to Japanese Patent Application No. 2011-285135 filed on Dec. 27, 2011, the contents of which are incorporated in their entirety herein by reference.

TECHNICAL FIELD

The present disclosure relates to an electronic key for a vehicle.

BACKGROUND

Conventionally, an electronic key (portable device) for a vehicle includes a casing body, in which a wireless communication device for a key is mounted, and a lid. This kind of electronic key for a vehicle is required to be downsized to improve portability and is required to be attached with a decorating member to improve design. Japanese Patent No. 3,706,233 discloses an electronic key for a vehicle having a fixation structure (snap fit structure) in which a detachment of a housing and a cover is restricted by elastic deformation of a holding rib including a hook part. In a case where the electronic key has the fixation structure, when a battery in the electronic key needs to be exchanged, the cover can be easily opened by applying a force to a fitting plane of the housing and the cover in a direction opposite from a fitting direction.

As a structure of attaching a decorating member to a casing body and a lid, the decorating member may be put between the casing body and the lid to easily attach the decorating member. However, in the above-described structure, a tolerance in a disassembling direction in not secured. Thus, when a force is applied to the decorating member in a twist direction, the casing body and the lid may be disassembled. In addition, because the decorating member is fixed only when the lid is fitted to the casing body, when the casing body and the lid are disassembled to exchange the battery, the decorating member may fall and may be lost. Furthermore, in a fixation structure in which the decorating member is merely put between the casing body and the lid, a fixing part of the decorating member needs to be large to secure strength of the decorating member. Thus, dimensions of the casing body and the lid need to be increased, and a dimension of the electronic key is likely to be increased.

SUMMARY

It is an object of the present disclosure to provide an electronic key for a vehicle that can restrict a decorating member from falling when a casing body and a lid are disassembled.

An electronic key for a vehicle according to an aspect of the present disclosure includes a casing body, a lid, and a decorating member. In the casing body, a wireless communication device that wirelessly communicates with a wireless communication device disposed in the vehicle is mounted. The lid is fitted to the casing body in a fitting direction at a fitting plane position so as to cover the casing body. The decorating member has a fixing part that is held between the casing body and the lid in a state where the casing body is fitted with the lid. The decorating member and one of the casing body and the lid have a restriction section at a position away from the fitting plane position in the fitting direction. The restriction section becomes an engagement state when a force is applied in an engagement direction that crosses the fitting direction and the restriction section restricts release of the engagement state when a force is applied in an engagement releasing direction opposite from the engagement direction.

In the electronic key, the restriction section can be the engagement state when the casing body and the lid are not fitted with each other. Thus, the decorating member can be restricted from falling when the casing body and the lid are disassembled.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION (First Embodiment)

Figure 1:
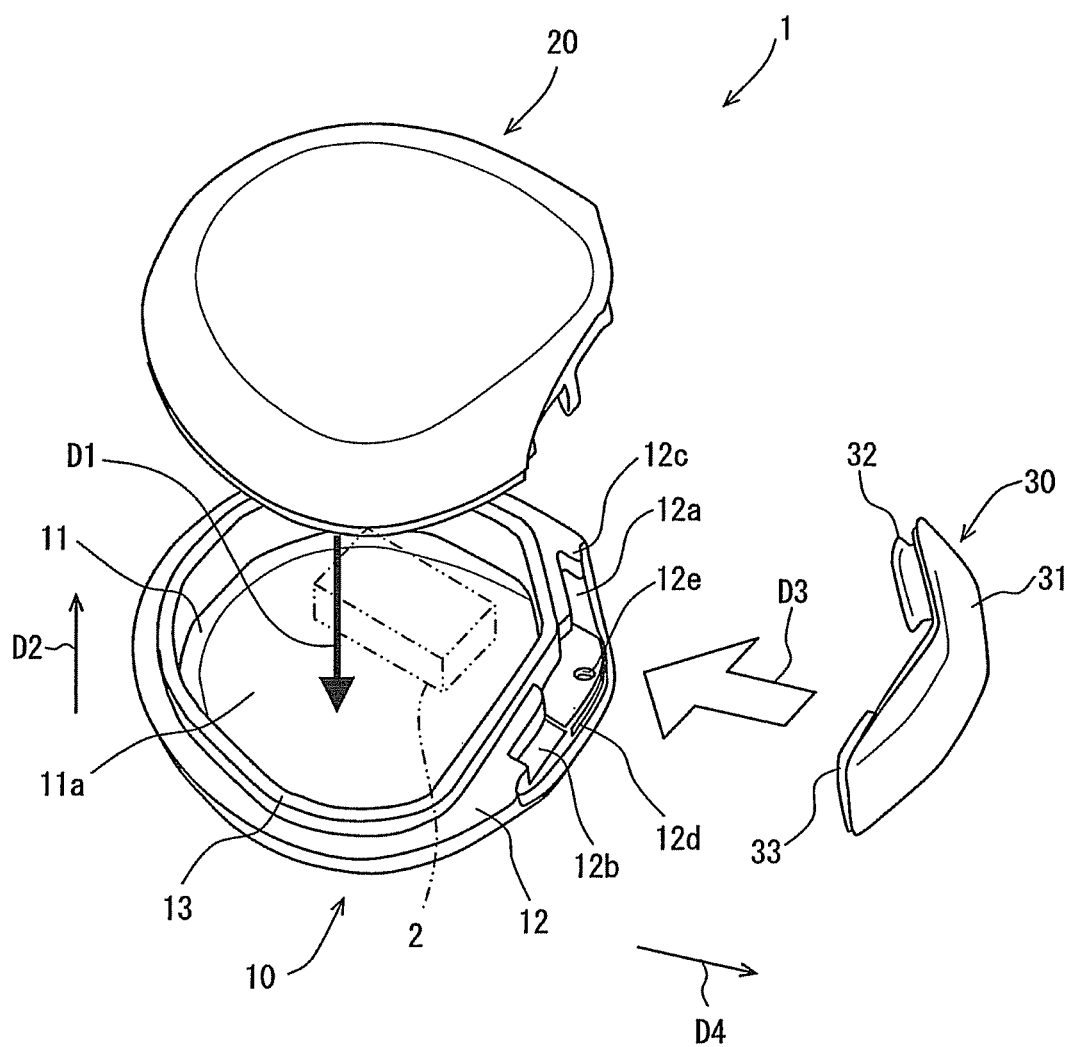
FIG. 1 is an exploded perspective view of an electronic key for a vehicle according to a first embodiment of the present disclosure.

An electronic key 1 for a vehicle according to a first embodiment of the present disclosure includes a casing body 10, a lid 20, and a decorating member 30. In the casing body 10, a wireless communication device 2 that wirelessly communicates with a wireless communication device (not shown) disposed in a vehicle is mounted. The lid 20 is attached to the casing body 10. The decorating member 30 includes fixing parts 32, 33 put between the casing body 10 and the lid 20.

In FIG. 1, an arrow D1 indicates a fitting direction in which the lid 20 is fitted to the casing body 10, an arrow D2 indicates a fitting releasing direction opposite from the fitting direction, an arrow D3 indicates an engagement direction in which the decorating member 30 engages with the casing body 10, and an arrow D4 indicates an engagement releasing direction opposite from the engagement direction. The engagement direction D3 and the engagement releasing direction D4 are perpendicular to the fitting direction D1 and the fitting releasing direction D2. In the present application, "perpendicular" include a case in which a line extending along the fitting direction D1 and a line extending along the engagement direction D3 cross each other at an angle within ±20 degrees from 90 degrees not only a case in which the lines cross each other at strictly right angles. Similarly, "a direction parallel to the engagement direction" includes a direction within ±20 degrees from the engagement direction not only a direction strictly parallel to the engagement direction.

The casing body 10 is made of thermoplastic resin such as polycarbonate (PC), polyethylene terephthalate (PET), and methacryl resin (PMMA). The casing body 10 is treated with a surface process (design process), such as painting and printing, for giving at least one of shape, pattern, and color, which define appearance of the electronic key 1.

As shown in FIG. 1 to FIG. 4, the casing body 10 includes a center part 11, a peripheral part 12, and a fitting part 13. The center part 11 includes a bottom surface 11a on which the wireless communication device 2 and a button battery to supply electricity to a circuit substrate in the wireless communication device 2 are mounted. The peripheral part 12 surrounds the center part 11. The peripheral part 12 has a horizontal plane at a position higher than the bottom surface 11a of the center part 11. The fitting part 13 includes a wall dividing the center part 11 and the peripheral part 12. A part of the wall has a linear shape in a plane and other part of the wall has an arc shape in the plane. The wall is higher than the peripheral part 12.

The peripheral part 12 includes engagement grooves 12a, 12b to which lower fixing portions 32b, 33b (see FIG. 5) of the fixing parts 32, 33 are respectively engaged. In front of the engagement groove 12a, that is, on a side in the engagement releasing direction D4, a hook 12c that restricts movement of the lower fixing portion 32b is disposed.

In a dead space S1 (see FIG. 4) located at a side portion of the peripheral part 12, an engagement depression 12d is provided. The engagement depression 12d corresponds to an engagement protruding part 34 (see FIG. 2) in the decorating member 30. The engagement depression 12d is a blind hole and extends in the engagement direction D3. The engagement depression 12d has a small height and a large width. In the engagement depression 12d, a hole 12e is provided. The hole 12e extends in a direction parallel to the fitting direction D1 and opens on an upper surface of the peripheral part 12. The hole 12e is receivable a projection 34a of the engagement protruding part 34.

The fitting part 13 includes a plurality of casing engagement portions 13a that forms a snap fit connection with lid engagement portions (not shown) in the lid 20. The snap fit connection between the casing engagement portions 13a and the lid engagement portions can be released, for example, by applying a force in the fitting direction D1 using a working tool.

The decorating member 30 is made of metal and is formed by injection molding. The decorating member 30 has a curved shape (boomerang shape) in a plane. The decorating member 30 includes a body part 31, the fixing parts 32, 33, and the engagement protruding part 34. The body part 31 has a through hole 31a into which a ring of a key holder or a string of a strap can be inserted. The fixing parts 32, 33 and the engagement protruding part 34 protrude from a rear surface of the body part 31 in the engagement direction D3.

Figure 5:
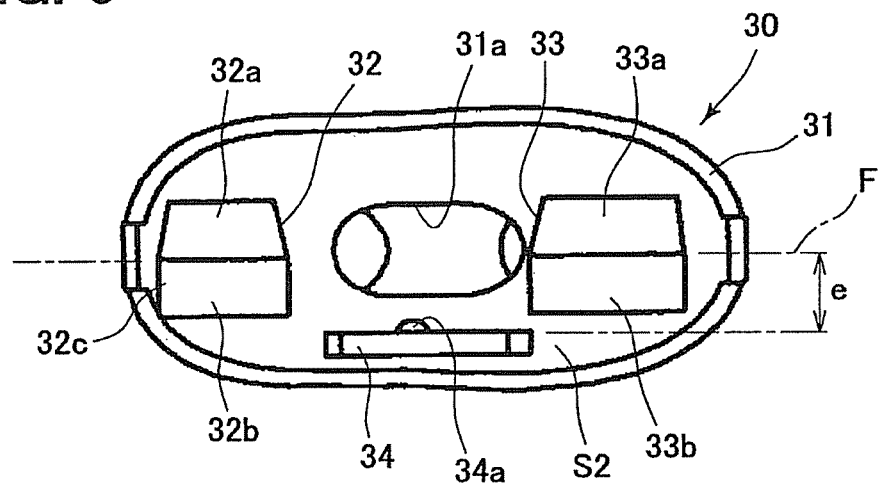
FIG. 5 is a rear view of the decorating member.

As shown in FIG. 5, the through hole 31a is defined at a center portion of the body part 31. The fixing parts 32, 33 are disposed at end portions of the body part 31. The engagement protruding part 34 is disposed in a dead space S2 in the body part 31, that is, at the center portion of the body part 31 under the through hole 31a.

Figure 7:
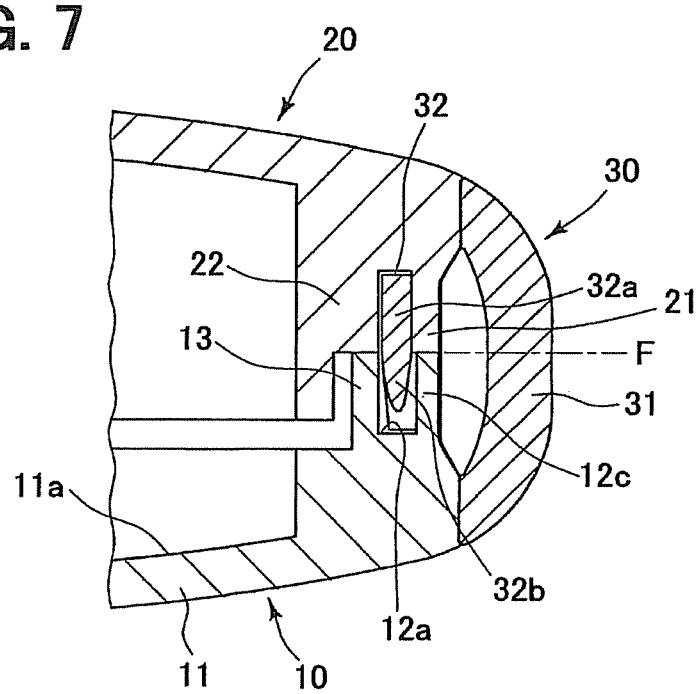
FIG. 7 is a cross-sectional view showing the state where the decorating member is attached to the casing body, which is taken along line VII-VII in FIG. 6.

The fixing part 32 includes the lower fixing portion 32b and an upper fixing portion 32a which are integrally formed. As shown in FIG. 7, the lower fixing portion 32b is held by the casing body 10. The upper fixing portion 32a is held between lid fixing parts 21, 22 of the lid 20. Similarly, the fixing part 33 includes the lower fixing portion 33b and an upper fixing portion 32a which are integrally formed. The lower fixing portion 33b is held by the casing body 10. The upper fixing portion 33a is held by the lid 20. As shown in FIG. 5, a boundary between the lower fixing portion 32b and the upper fixing portion 32a and a boundary between the lower fixing portion 33b and the upper fixing portion 33a are both located at a fitting plane position F of the casing body 10 and the lid 20.

Figure 2:
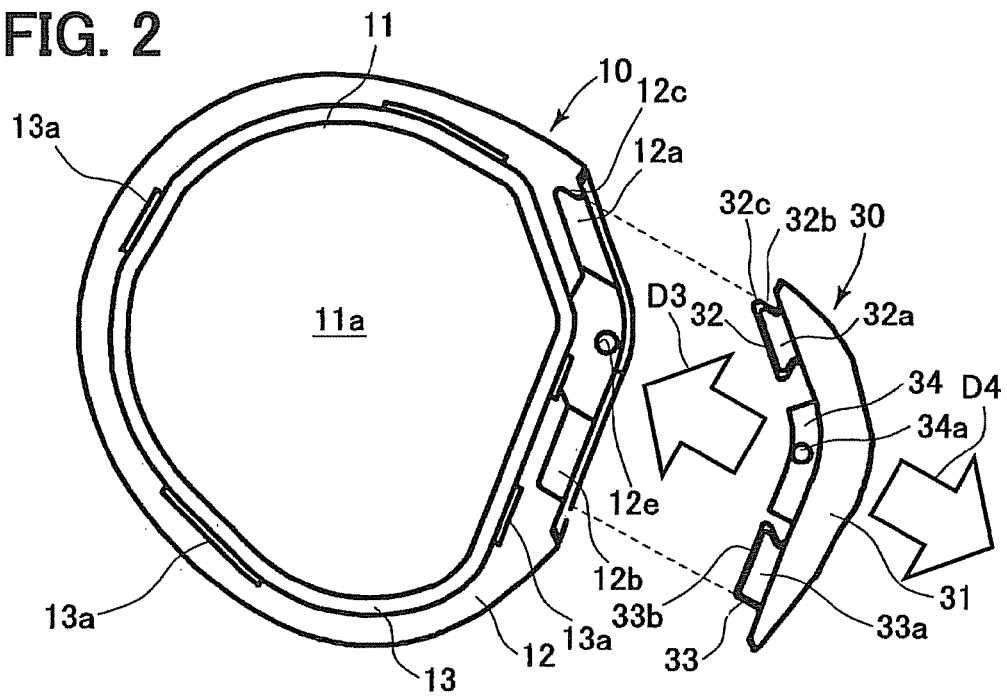
FIG. 2 is a plan view of a casing body and a decorating member.
Figure 3:
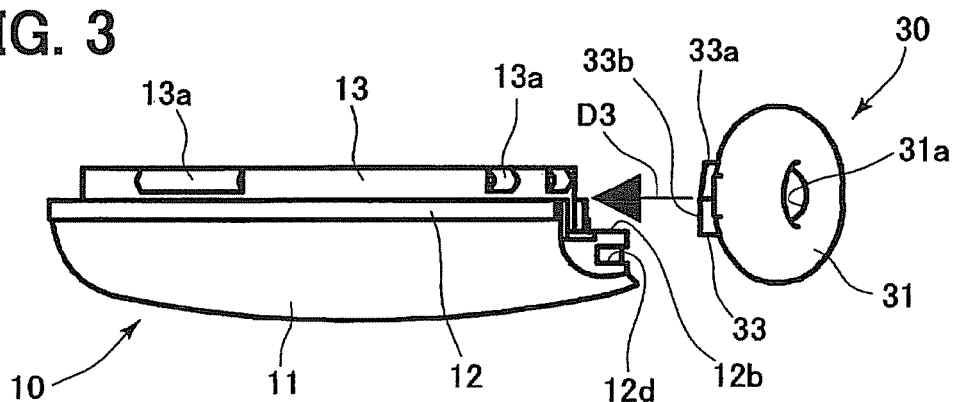
FIG. 3 is a side view of the casing body and the decorating member.
Figure 4:
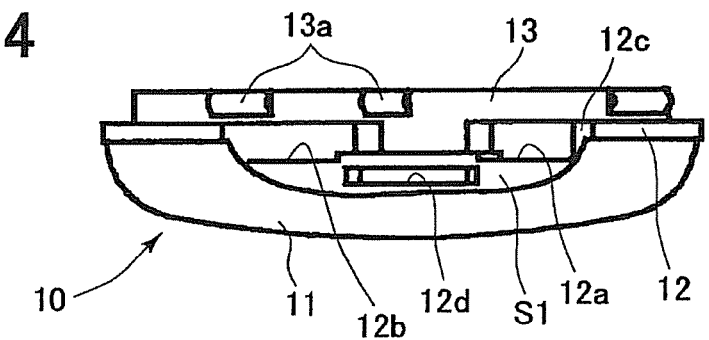
FIG. 4 is a front view of the casing body.

As shown in FIG. 2, an engagement claw 32c is disposed at an outer end portion of the lower fixing portion 32b. The engagement claw 32c engages with the engagement groove 12a in the engagement direction D3. At an outer end portion of the lower fixing portion 33b, an element corresponding to the engagement claw 32c is not disposed. However, in order to restrict movement of the decorating member 30 more strictly, a hook similar to the hook 12c may be disposed in front of the engagement groove 12b, that is, on a side in the engagement releasing direction D4, and the lower fixing portion 33b may include an engagement claw similar to the engagement claw 32c.

As shown in FIG. 5, the engagement protruding part 34 is disposed at a portion of the body part 31 at a distance of "e" from the fitting plane position F of the casing body 10 and the lid 20. The engagement protruding part 34 has a small height and a large width. On an upper surface of the engagement protruding part 34, the projection 34a that protrudes in parallel with the fitting direction D1 is disposed.

Figure 6:
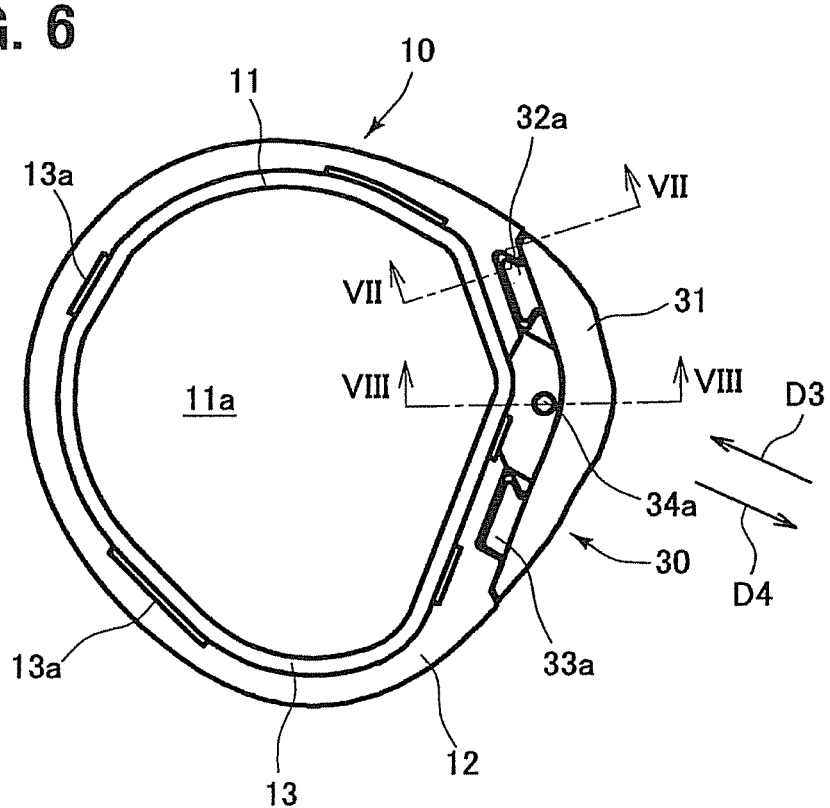
FIG. 6 is a plan view showing a state where the decorating member is attached to the casing body.

In the present embodiment, the decorating member 30 is attached to the basing body 10 in a state where the decorating member 30 moves in parallel with the engagement direction D3 shown in FIG. 2. In other words, the decorating member 30 can be inserted to the casing body 10 only in the engagement direction D3. The lower fixing portion 32b, the lower fixing portion 33b, and the engagement protruding part 34 in the decorating member 30 are respectively inserted into the engagement groove 12a, the engagement groove 12b, and the engagement depression at the same time. As shown in FIG. 6, in a state where the lower fixing portion 32b, the lower fixing portion 33b, and the engagement protruding part 34 are respectively inserted in the engagement groove 12a, the engagement groove 12b, and the engagement depression 12d, movement of the decorating member 30 in a direction other than the engagement direction D3 and the engagement releasing direction D4 is restricted in a plane. Furthermore, when the projection 34a of the engagement protruding part 34 is inserted in the hole 12e of the engagement depression 12d, movement of the decorating member 30 in the engagement direction D3 and the engagement releasing direction D4 are also restricted. Accordingly, the decorating member 30 is restricted from falling from the casing body 10.

As shown in FIG. 1, the lid 20 is fitted to the casing body 10 in the fitting direction at the fitting plane position F so as to cover the casing body 10. As shown in FIG. 7, the lid 20 includes the lid fixing parts 21, 22. The upper fixing portions 32a, 33a of the fixing parts 32, 33 in the decorating member 30 are held between the lid fixing parts 21, 22.

Figure 13:
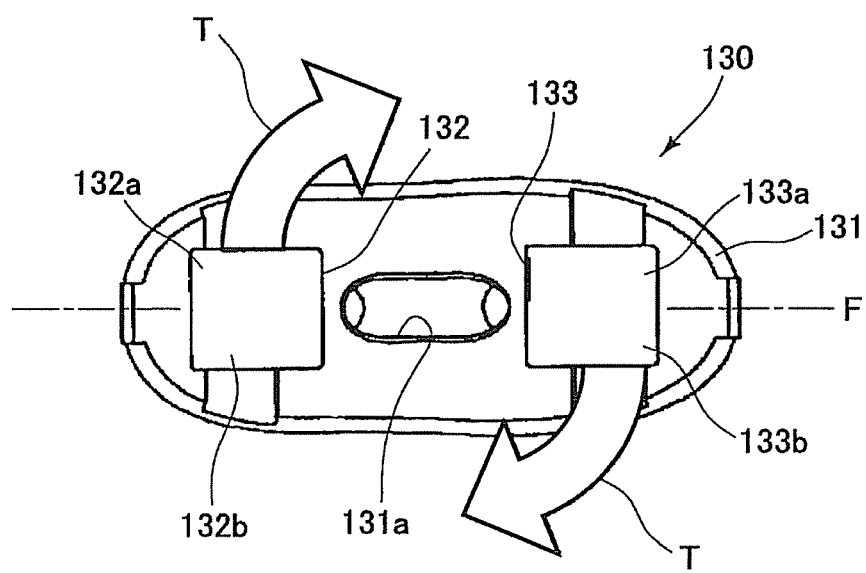
FIG. 13 is a rear view of the decorating member according to the comparative example.

In the electronic key 1 according to the present embodiment, the engagement depression 12d and the engagement protruding part 34, which engages with each other when a force is applied in the engagement direction D3, can operate as a restriction section. In other words, as shown in FIG. 6, when the decorating member 30 is attached to the casing body 10 and the engagement protruding part 34 engages with the engagement depression 12d, movement of the decorating member 30 in the fitting releasing direction D2 with respect to the casing body 10 can be restricted and a rotation of the decorating member 30 in a twist direction (see FIG. 13) can also be restricted.

Figure 8:
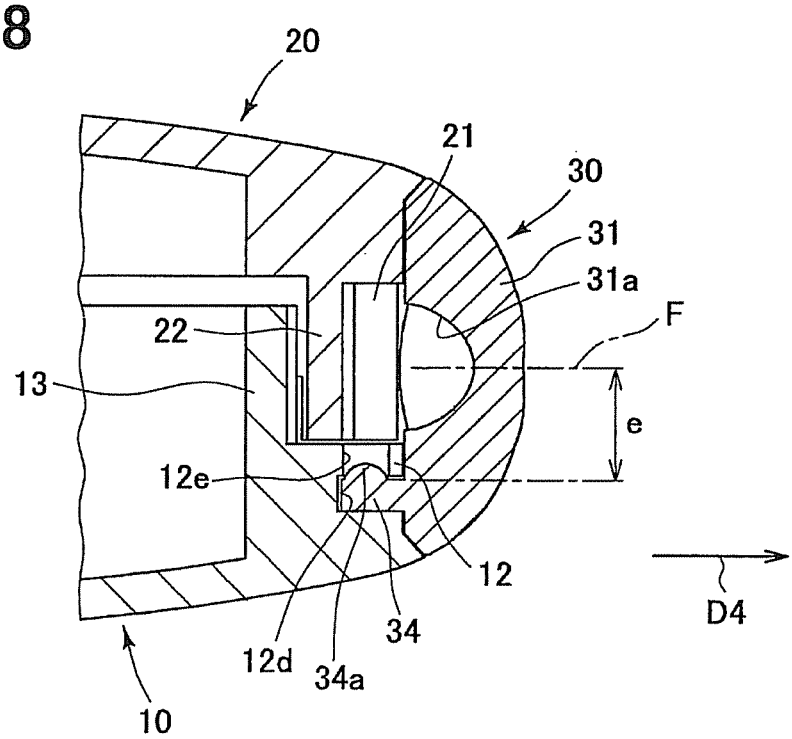
FIG. 8 is a cross-sectional view showing the state where the decorating member is attached to the casing body, which is taken along line VIII-VIII in FIG. 6.

Furthermore, when the projection 34a of the engagement protruding part 34 is fitted into the hole 12e of the engagement depression 12d, as shown in FIG. 8, movement, of the decorating member 30 in the engagement releasing direction D4 with respect to the casing body 10 can be restricted.

The engagement claw 32c of the decorating member 30 and the engagement groove 12a of the casing body 10, which engages with each other in the engagement direction D3 can operate as the restriction section. As shown in FIG. 6 and FIG. 7, when the decorating member 30 is attached to the casing body 10 and the engagement protruding part 34 engages with the engagement depression 12d, the engagement claw 32c engages with the engagement groove 12a. Accordingly, as shown in FIG. 7, movement of the decorating member 30 in the engagement releasing direction D4 with respect to the casing body 10 can be restricted.

Furthermore, movement of the decorating member 30 in the engagement releasing direction D4 is restricted by the insertion of the projection 34a into the hole 12e and the engagement of the engagement claw 32c and the engagement groove 12a, and holding of the upper fixing portions 32a, 33a between the lid fixing parts 21, 22. In other words, when the casing body 10, the lid 20, and the decorating member 30 are assembled, the decorating member 30 is fixed in three axial directions.

As is clear from the above description, in the electronic key 1 according to the present embodiment, in a state where the decorating member 30 is attached to the casing body 10, movement of the decorating member 30 in the engagement direction D4 with respect to the casing body 10 can be restricted, and rotation of the decorating member 30 in the twist direction can also be restricted. In other words, the decorating member 30 can be fixed in the three axial directions with respect to the casing body 10. Thus, even when the casing body 10 and the lid 20 are disassembled to exchange the battery, the decorating member 30 does not fall from the casing body 10. Accordingly, loss of the decorating member 30 can be restricted, and the battery can be exchanged easily.

The engagement depression 12d of the casing body 10 and the engagement protruding part 34 of the decorating member 30 are respectively disposed in the dead space S1 of the casing body 10 and the dead space S2 of the decorating member 30. Thus, even when the fixing parts 32, 33 of the decorating member 30 are small, a fixing strength can be secured by the engagement depression 12d and the engagement protruding part 34. Thus, the dimension of the decorating member 30 can be reduced, and eventually the dimensions of the casing body 10 and the lid 20 can also be reduced.

In the electronic key 1 according to the present embodiment, the decorating member 30 and the casing body 10 have the restriction section, such as the engagement protruding part 34, the engagement depression 12d, the engagement claw 32c, and the engagement groove 12a, at a position away from the fitting plane position F in the fitting direction D1. The restriction section becomes an engagement state when a force is applied in the engagement direction D3 and the restriction section restricts release of the engagement state when a force is applied in an engagement releasing direction D4. Thus, even when than angular moment acts to the decorating member 30 in the twist direction, the angular moment is received by the restriction section, and a force to disassemble the casing body 10 and the lid 20 is less likely to act. Therefore, the restriction section can appropriately restrict disassembling of the casing body 10 and the lid 20.

In addition, when the casing body 10 and the lid 20 are not fitted with each other, the decorating member 30 can engage with the casing body 10. Even when the casing body 10 and the lid 20 are disassembled to exchange the battery, fall of the decorating member 30 can be restricted. Accordingly, loss of the decorating member 30 can be restricted, and the battery can be exchanged easily. When the decorating member 30 is attached to the casing body 10, the decorating member 30 has to be moved only in the engagement direction 03 with respect to the casing body 10. Thus, the decorating member 30 can be attached to the casing body 10 easily.

Furthermore, because the restriction section is disposed in the dead space S1 of the casing body 10 and the dead space S2 in the decorating member 30, the restriction section can secure the fixing strength even when the fixing parts 32, 33 in the decorating member 30 are small. Thus, the dimension of the decorating member 30 can be reduced, and eventually the dimensions of the casing body 10 and the lid 20 can be reduced.

An electronic key 1a for a vehicle according to a comparative example will be described with reference to FIG. 10 to FIG. 13. Components which function similarly to the components in the electronic key 1 according to the first embodiment are indicated by reference numbers of one hundreds including the same reference numbers, and a detailed description about the components will be omitted. For example, a casing body according to the comparative example, which functions similarly to the casing body 10 according to the first embodiment, is indicated by 110.

In the electronic key 1a, fixing parts 132, 133 of a decorating member 130 is fixed at a fitting plane position F of the casing body 110 and a lid 120. A fitting direction D1 of the lid 120 with respect to the casing body 110, and an engagement direction D3 of the decorating member 130 with respect to the casing body 110 are set in the same direction in view of attachment. The fixing parts 132, 133 of the decorating member 130 are held between the casing body 110 and the lid 120 at the fitting plane position F. In a state where the decorating member 130 is attached to the casing body 110, a binding force is not applied to the decorating member 130 in the engagement releasing direction D4. Thus, the decorating member 130 may fall from the casing body 110 due to self-weight.

Also in the electronic key 1a, the decorating member 130 is fixed in three axial directions when the casing body 110, the lid 120 and the decorating member 130 are assembled. However, if an angular moment is generated at the fixing parts 132, 133 of the decorating member 130 in a twist direction T, because a tolerance in a fitting releasing direction of the casing body 110 and the lid 120 is small, the fitting of the casing body 110 and the lid 120 is released by the angular moment, and the electronic key 1a may be disassembled.

Figure 9:
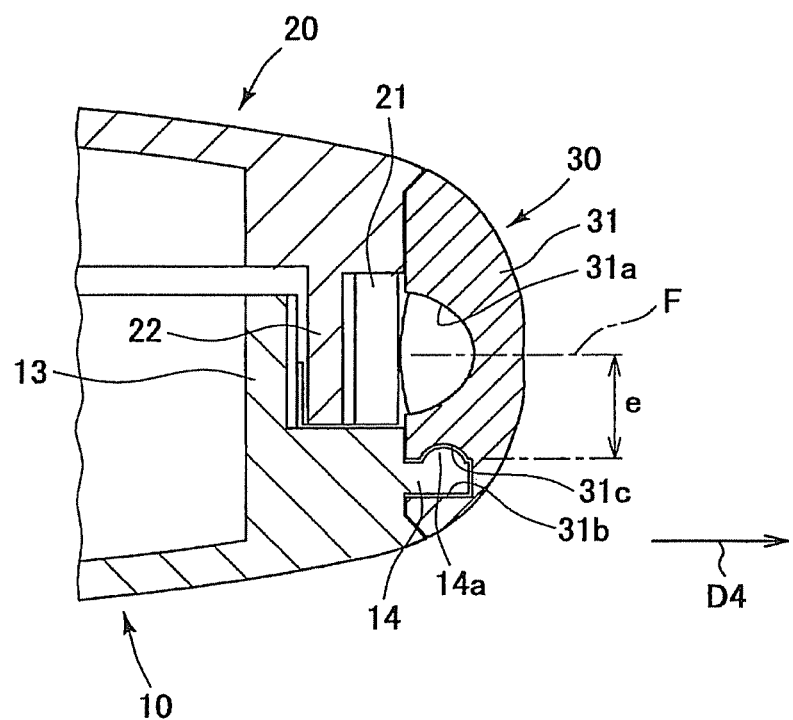
FIG. 9 is a cross-sectional view showing a state where a decorating member is attached to a casing body in an electronic key according to a modification.
Figure 10:
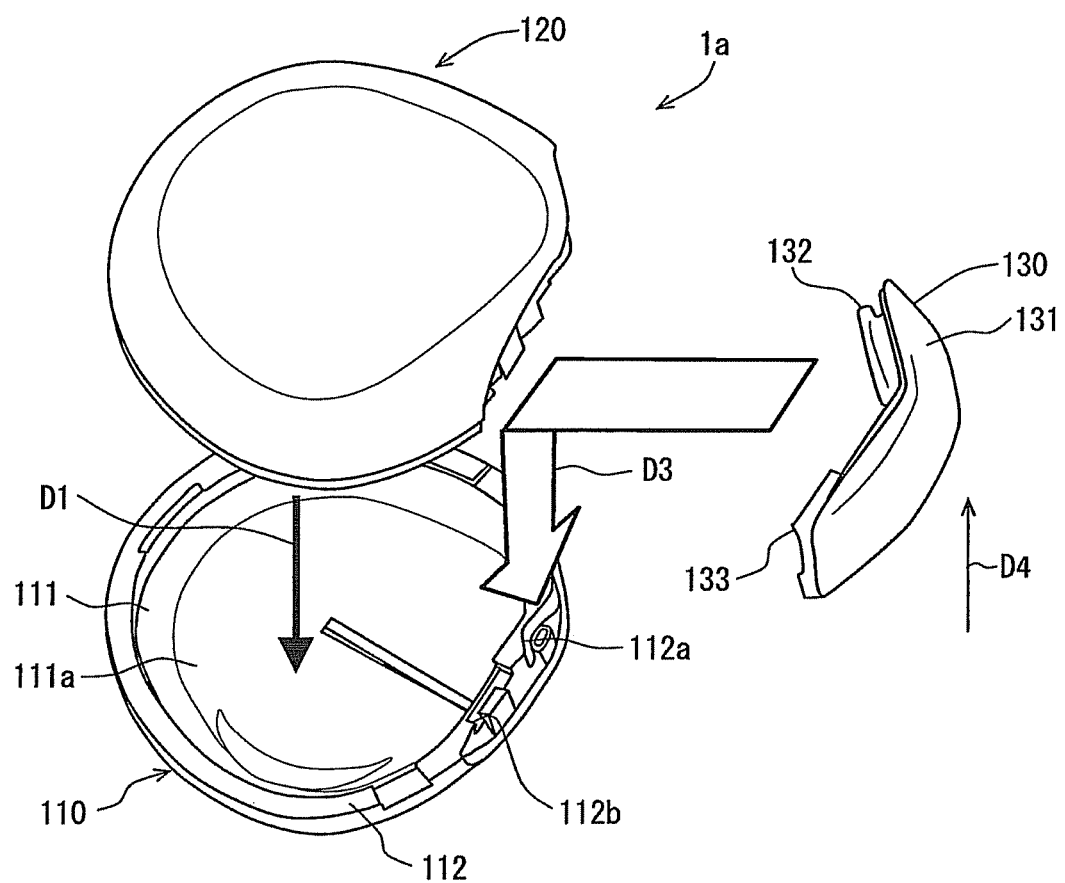
FIG. 10 is an exploded perspective view of an electronic key for a vehicle according to a comparative example.
Figure 11:
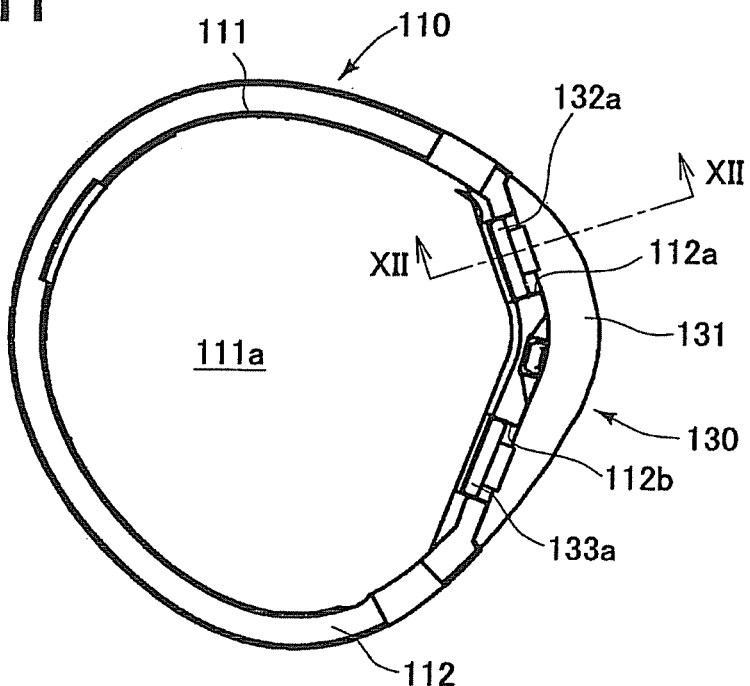
FIG. 11 is a plan view showing a state where a decorating member is attached to a casing body in the electronic key according to the comparative example.
Figure 12:
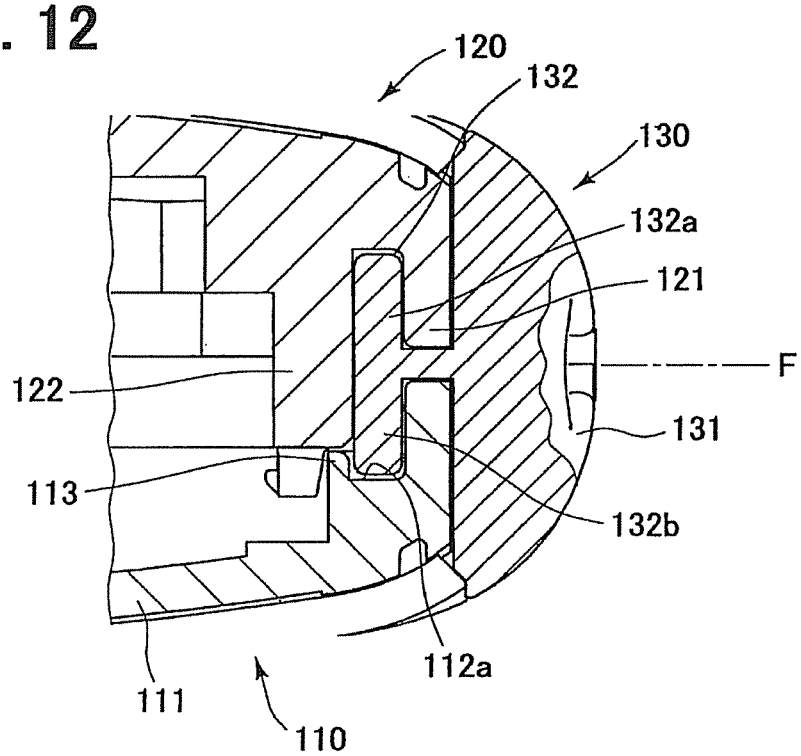
FIG. 12 is a cross-sectional view showing the state where the decorating member is attached to the casing body, which is taken along line XII-XII in FIG. 11.

In the electronic key 1 according to the first embodiment, the casing body 10 includes the engagement depression 12d, and the decorating member 30 includes the engagement protruding part 34. In an electronic key according to a first modification, as shown in FIG. 9, the casing body 10 may include an engagement protruding part 14 having a projection 14a, and the decorating member 30 may include an engagement depression 31b having a hole 31c Also in the electronic key according to the first modification, the decorating member 30 can be fixed in the three axial directions with respect to the casing body 10. Due to an engagement of the engagement protruding part 14 having the projection 14a and the engagement depression 31b having the hole 31c at a distance of "e" from the fitting plane position F, even when an angular moment acts to the decorating member 30 in a twist direction, release of fitting of the casing body 10 and the lid 20 can be restricted.

In an electronic key according to a second modification, the engagement protruding part 34 may have a hole, and the engagement depression 13d may have a projection.

Also in the electronic key according to the second modification, movement of the decorating member 30 in the engagement releasing direction D4 with respect to the casing body 10 can be restricted.

In the first embodiments and the above-described modifications, the decorating member 30 is attached to the casing body 10. In an electronic key according to a third modification, the decorating member 30 may be attached to the lid 20.

In the electronic key according to the third modification, the decorating member 30 can be fixed in three axial directions with respect to the lid 20. Thus, even when an angular moment acts to the decorating member 30 in a twist direction, release of fitting of the casing body 10 and the lid 20 can be restricted.

What is claimed is:

1. A vehicular electronic key having a function of opening and closing a vehicle door from outside a vehicle, comprising:
    a casing body in which a wireless communication device that wirelessly communicates with a wireless communication device disposed in the vehicle is mounted;
    a lid fitted to the casing body at a fitting plane position so as to cover the casing body; and
    a decorating member having a fixing part that is held between the casing body and the lid in a state where the casing body is fitted with the lid,
    wherein the decorating member and one of the casing body and the lid have a restriction section at a position away from the fitting plane position in a fitting direction of the casing body and the lid, and
    wherein the restriction section becomes an engagement state when a force is applied in an engagement direction that crosses the fitting direction and the restriction section restricts release of the engagement state when a force is applied in an engagement releasing direction opposite from the engagement direction.

2. The vehicular electronic key according to claim 1,
    wherein the restriction section includes a first restriction portion including an engagement depression and an engagement protruding part that engage with each other when the force is applied in the engagement direction,
    wherein one of the engagement depression and the engagement protruding part has a projection protruding in parallel with the fitting direction, and the other of the engagement depression and the engagement protruding part has a hole extending in parallel with the fitting direction and being receivable of the projection,
    wherein movement of the decorating member in a fitting releasing direction opposite from the fitting direction with respect to the one of the casing body and the lid is restricted by engagement of the engagement protruding part with the engagement depression, and
    wherein movement of the decorating member in the engagement releasing direction with respect to the one of the casing body and the lid is restricted by insertion of the projection into the hole.

3. The vehicular electronic key according to claim 2,
    wherein the restriction section further includes a second restriction portion including an engagement claw and an engagement groove that engages with each other in the engagement direction,
    wherein the engagement claw is disposed in the fixing part of the decorating member, and the engagement groove is disposed on a rear side of a hook at a position of the one of the casing body and the lid between which the fixing part is held, and
    wherein when the engagement protruding part engages with the engagement depression, movement of the decorating member in the engagement releasing direction with respect to the one of the casing body and the lid is restricted by engagement of the engagement claw and the engagement groove.

4. The vehicular electronic key according to claim 3,
    wherein the first restriction portion and the second restriction portion restrict movement of the decorating member in the engagement releasing direction with respect to the one of the casing body and the lid, and
    wherein the casing body and the lid restrict movement of the decorating member in the fitting releasing direction by holding the fixing part between the casing body and the lid.

* * * * *